(12) United States Patent
Meruva et al.

(10) Patent No.: US 12,354,203 B2
(45) Date of Patent: Jul. 8, 2025

(54) DATACENTER DASHBOARD WITH TEMPORAL FEATURES

(71) Applicant: Honeywell International Inc., Charlotte, NC (US)

(72) Inventors: Jayaprakash Meruva, Bangalore (IN); Magesh Lingan, Bangalore (IN); Rajkumar Palanivel, Cumming, GA (US); Srikanth Nagaraj, Bangalore (IN); Devanshu Dugar, Kolkata (IN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 0 days.

(21) Appl. No.: 18/483,450

(22) Filed: Oct. 9, 2023

(65) Prior Publication Data

US 2024/0037831 A1 Feb. 1, 2024

Related U.S. Application Data

(63) Continuation of application No. 17/399,547, filed on Aug. 11, 2021, now Pat. No. 11,816,774.

(51) Int. Cl.
*G06T 13/80* (2011.01)
*G06F 3/04817* (2022.01)
(Continued)

(52) U.S. Cl.
CPC .......... *G06T 13/80* (2013.01); *G06F 3/04817* (2013.01); *G06F 3/04847* (2013.01);
(Continued)

(58) Field of Classification Search
CPC ..... G06T 13/80; G06T 7/004; G06T 2200/24; G06T 2207/30164; G06T 11/206; G06F 3/04817; G06F 3/04847
See application file for complete search history.

(56) References Cited

U.S. PATENT DOCUMENTS 9,762,460 B2 9/2017 Pawlowski et al.
10,983,891 B2 4/2021 Dadd et al.
(Continued)

OTHER PUBLICATIONS

"Data Center Efficiency: The Benefits of RCI & RTI," (Part 2 of 3), Blog, Posted by RF Code, 10 pages, May 11, 2021.
(Continued)

*Primary Examiner* — Antonio A Caschera
(74) *Attorney, Agent, or Firm* — Seager, Tufte & Wickhem, LLP

(57) ABSTRACT

A system and method for monitoring performance of an industrial process includes an input port for receiving signals representative of one or more performance parameters generated by the industrial process, a user interface including a display and a controller that is operably coupled with the input port and the user interface. The controller is configured to repeatedly receive signals over time via the input port representative of the one or more performance parameters of the industrial process and to generate a plurality of snapshots, wherein each snapshot includes a graphical representation of the one or more performance parameters of the industrial process at a corresponding time. The controller is configured to generate an animatable heat map including two or more of the plurality of snapshots arranged temporally and to display the animatable heat map on the display.

17 Claims, 13 Drawing Sheets

(51) Int. Cl.
*G06F 3/04847* (2022.01)
*G06T 7/00* (2017.01)

(52) U.S. Cl.
CPC ........ *G06T 7/0004* (2013.01); *G06T 2200/24* (2013.01); *G06T 2207/30164* (2013.01)

(56) References Cited

U.S. PATENT DOCUMENTS

| | | | |
|---|---|---|---|
| 2013/0016106 A1* | 1/2013 | Yip | G09B 29/006 345/440 |
| 2014/0218389 A1 | 8/2014 | Bennett et al. | |
| 2016/0011925 A1 | 1/2016 | Kulkarni et al. | |
| 2018/0052574 A1 | 2/2018 | Wolfe et al. | |

OTHER PUBLICATIONS

"Enterprise Dashboard,"—Galileo Performance Explorer Blog, 8 pages, May 13, 2021.
"Galileo—the Stars Align Overview," Galileo Performance Explorer, 1 page, 2017.
"Galileo Performance Explorer—IT Capacity & Performance Management," Blog, The Explorer, 7 pages, May 13, 2021.
"Galileo Performance Explorer—SAN Performance Monitoring," ATS Group, 1 page, 2021.
"Galileo Solution Guide Performance Monitoring Vmware," ATS Group, 20 pages, 2021.
"Galileo Use Cases Capacity Planning," Galileo Performance Explorer, 1 page, 2018.
"Operational Intelligence" Galileo Performance Explorer, 8 pages, May 13, 2021.
"Performance Monitoring" Galileo Performance Explorer, 8 pages, May 13, 2021.
"Predictive Analytics" Galileo Performance Explorer, 8 pages, May 13, 2021.
Alfsolli, "Environmental Monitoring with Zabbix," Zabbix Blog, 8 pages, May 13, 2021.
Lambert, "Trend Prediction Tutorial in Zabbix 4.0," Zabbix Blog, 2019.
Nevalainen, "A Comparative Study of Monitoring Data Center Temperature Through Visualizations in Virtual Reality Versus 2D Screen" KTH—School Electrical Engineering and Computer Science Aalto University—School of Science. Jul. 21, 2018 https://kth.diva-portal.org/smash/get/diva2:1237751/FULLT (Year: 2018).

* cited by examiner

DATACENTER DASHBOARD WITH TEMPORAL FEATURES

This is a continuation of co-pending U.S. Patent Application Ser. No. 17/399,547, filed Aug. 11, 2021, and entitled "DATACENTER DASHBOARD WITH TEMPORAL FEATURES", which is incorporated herein by reference.

TECHNICAL FIELD

The present disclosure pertains generally to monitoring industrial processes and more particularly to systems and methods for monitoring industrial processes.

BACKGROUND

A variety of industrial processes are known. An example of an industrial process is a datacenter, in which a number of computer servers exist in close proximity to each other. It will be appreciated that computer servers can generate substantial amounts of heat while running. Accordingly, a datacenter typically has a cooling system that is dedicated to removing heat from the datacenter by circulating cool air through the datacenter. Reliable performance of the computer servers rely on the cooling system to keep the computer servers operating at acceptable temperatures without overheating. Cooling systems can develop faults that impact the ability of the cooling system to cool the datacenter. A need remains for improved systems for monitoring the performance of industrial processes such as datacenters.

Summary

This disclosure relates generally to monitoring industrial processes such as datacenters. An example may be found in a system for monitoring performance of an industrial process that generates one or more performance parameters. The illustrative system includes an input port for receiving signals representative of the one or more performance parameters of the industrial process, a user interface including a display and a controller that is operably coupled with the input port and the user interface. The controller is configured to repeatedly receive signals over time via the input port representative of the one or more performance parameters of the industrial process and to generate a plurality of snapshots, wherein each snapshot includes a graphical representation of the one or more performance parameters of the industrial process at a corresponding time. The controller is configured to generate an animatable heat map including two or more of the plurality of snapshots arranged temporally and to display the animatable heat map on the display.

Another example may be found in a system for monitoring performance of an industrial process that generates one or more performance parameters. The illustrative system includes an input port for receiving signals representative of the one or more performance parameters of the industrial process, a user interface including a display and a controller that is operably coupled with the input port and the user interface. The controller is configured to repeatedly receive signals over time via the input port that are representative of the one or more performance parameters of the industrial process. The controller is configured to display a timeline on the display, the timeline includes a current play position marker that indicates a current play position time along the timeline as well as to display a selected time of a time elapse heat map on the display. The time elapse heat map is a graphical representation of one or more of the performance parameters of the industrial process over time, the current play position time of the timeline controls the selected time of the time elapse heat map. In some cases, the controller is configured to display on the display an event log concurrently with the timeline and the selected time of the time elapse heat map, wherein the event log includes one or more events identified based at least in part on one or more of the performance parameters of the industrial process and occurring within a first threshold time of the current play position time.

Another example may be found in a non-transient, computer-readable medium having instructions stored thereon. When the instructions are executed by one or more processors, the one or more processors are caused to repeatedly receive signals over time representative of the one or more performance parameters of an industrial process. The one or more processors are caused to display a timeline on a display, the timeline includes a current play position marker that indicates a current play position time along the timeline. The one or more processors are caused to generate and display a heat map that is a graphical representation of one or more of the performance parameters of the industrial process at the current play position time of the timeline as well as to generate and display an event log concurrently with the timeline and the heat map, the event log including one or more events identified based at least in part on one or more of the performance parameters of the industrial process and that occurred within a first threshold time of the current play position time of the timeline. The one or more processors are caused to display an event marker along the timeline for each of one or more of the identified events, each event marker positioned along the timeline at a time that corresponds to a time of occurrence of the corresponding event.

The preceding summary is provided to facilitate an understanding of some of the features of the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments of the disclosure in connection with the accompanying drawings, in which.

Figure 1:
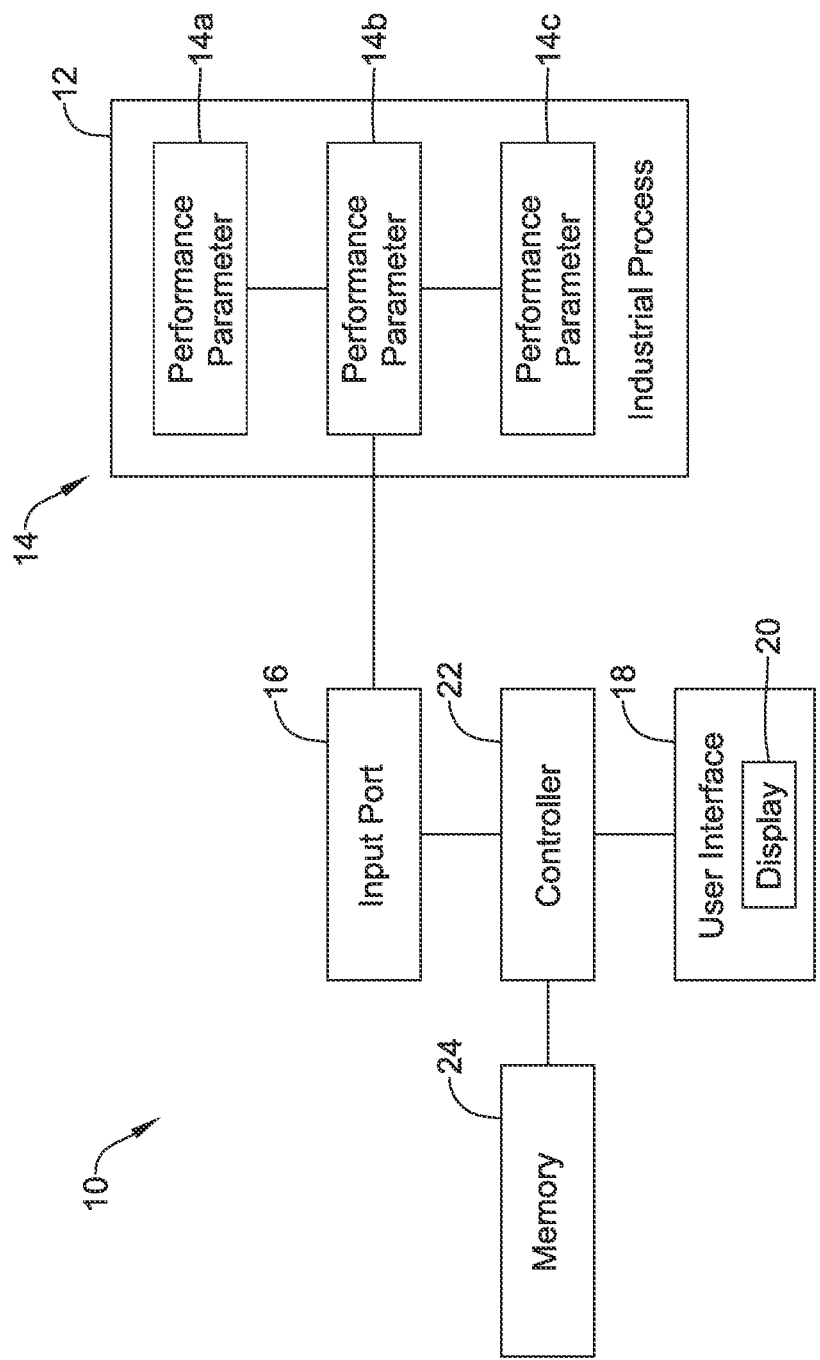
FIG. 1 is a schematic block diagram of an illustrative system for monitoring performance of an industrial process.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements. The drawings, which are not necessarily to scale, are not intended to limit the scope of the disclosure. In some of the figures, elements not believed necessary to an understanding of relationships among illustrated components may have been omitted for clarity.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

FIG. 1 is a schematic block diagram of an illustrative system 10 for monitoring an industrial process 12. The industrial process 12 may be considered as including several performance parameters 14, individually labeled as 14a, 14b, 14c. While a total of three performance parameters 14 are shown, it will be appreciated that this is merely illustrative as the industrial process 12 may include any number of performance parameters 14 and may in some cases includes tens, hundreds or even thousands of performance parameters 14. In some cases, at least some of the performance parameters 14 may represent process variables. Process variables are variables that may be measured by a sensor or other instrument, and may be used as inputs to a controller or other control mechanism, for example. In some cases, there may be a desire to optimize or otherwise control one or more process variables such that each of the one or more process variables hit or at least approach a set point value for each of the one or more process variables.

Examples of process variables can include temperature, density, level, flow, pH, mass and conductivity, among others. At least some of the performance parameters 14 may include manipulated variables, which can be changed or otherwise manipulated in order to affect desired changes in one or more of the process variables. As an example, if a process variable pertains to flow through a valve, a corresponding manipulated variable may be a relative position (open, closed, etc.) of that valve. This is just an example, and is not intended to be limiting in any manner.

The nature of the performance parameters 14 may vary, depending on what type of process the industrial process 12 represents. For example, the industrial process 12 may represent an oil refinery, and the performance parameters 14 may represent temperatures of various flows through the refinery, pressures of various flows through the refiner, concentrations of particular components within one or more of the various flows, and the like. If the industrial process 12 represents a data center in which a number of computer servers are running, at least some of the performance parameters 14 may include process variables such as air temperature, air humidity and energy consumption, for example.

It will be appreciated that energy consumption for a data center includes not only the electrical power consumed by the computer servers, but also power consumed by the cooling systems used to control the temperature and/or humidity in and around the computer servers (e.g. in the computer server racks). Simply operating the cooling system at full capacity at all times would certainly keep the computer servers cool, but would consume excess electrical power and may be wearing on the cooling system causing increase maintenance. Accordingly, there is a balancing act between the electrical power consumed by the cooling system and the overall thermal performance of the data center.

The illustrative system 10 includes an input port 16 for receiving signals that are representative of the one or more performance parameters 14. The input port 16 may represent one or more wiring terminals for receiving wires that extend from particular sensors or instruments within the industrial process 12 and that carry electrical signals. Alternatively, or in addition, the input port 16 may represent a transceiver for wirelessly receiving signals that are representative of the one or more performance parameters 14. Any of a variety of different wireless communication protocols may be used.

The illustrative system 10 includes a user interface 18 that includes a display 20. While not illustrated, in some cases the user interface 18 may also include a keyboard, mouse, track ball or touch pad suitable for allowing a user to enter information/commands into the system 10. A controller 22 is operably coupled with the input port 16 and with the user interface 18. In some cases, the system 10 may also include a memory 24 that is operably coupled with the controller 22. While a single controller 22 is shown, it will be appreciated that in some cases the system 10 may include two or more controllers 22 operating in tandem, for example. The controller 22 may receive signals representative of the performance parameters 14 via the input port 16 and may process the signals to provide useful information that may be stored via the memory 24 and/or outputted via the display 20. The controller 22 may perform a number of tasks useful in monitoring performance of the industrial process 12, for example. FIGS. 2 through 6 are flow diagrams showing examples of tasks that the controller 22 may be configured to perform as part of monitoring the performance of the industrial process 12.

Figure 2:
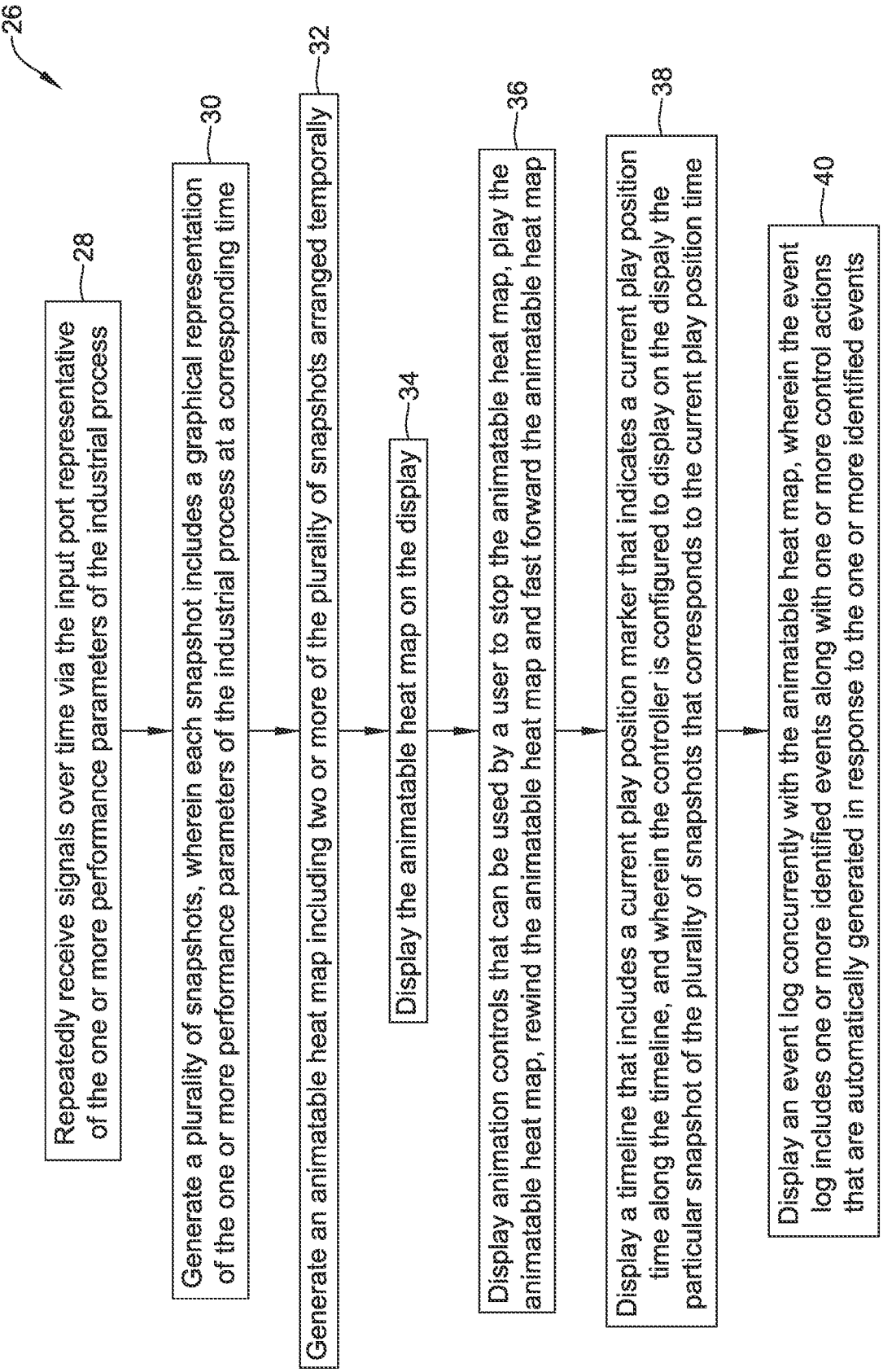
FIG. 2 is a flow diagram showing what the illustrative system of FIG. 1 may be configured to perform.

FIG. 2 is a flow diagram showing an illustrative list of tasks 26 that the controller 22 may be configured to carry out in monitoring the industrial process 12. The controller 22 may be configured to repeatedly receive signals over time via the input port 16 that are representative of the one or more performance parameters 14 of the industrial process 12, as indicated at block 28. The controller 22 may be configured to generate a plurality of snapshots, wherein each snapshot includes a graphical representation of the one or more performance parameters 14 of the industrial process 12 at a corresponding time, as indicated at block 30. The controller 22 may be configured to generate an animatable heat map including two or more of the plurality of snapshots arranged temporally, as indicated at block 32 as well as to display the animatable heat map on the display 20, as indicated at block 34. In some instances, the animatable heat map may include a number of snapshots arranged temporally. For example, a snapshot may be generated every second, every minute, every five minutes, or every ten minutes. Other time intervals are contemplated. The snapshots can be temporally assembled into something resembling a video clip that can be played, rewound, and fast forwarded. While this is one approach for producing an animatable heat map, it is contemplated that any other suitable technique or approach may be used.

In some cases, and as indicated at block 36, the controller 22 may be configured to display animation controls that can be used by a user to stop the animatable heat map, play the animatable heat map, rewind the animatable heat map and fast forward the animatable heat map. These controls are just examples. In some cases, and as indicated at block 38, the controller 22 may be configured to display a timeline that includes a current play position marker that indicates a current play position time along the timeline. The controller 22 may be configured to display on the display 20 the particular snapshot of the plurality of snapshots that corresponds to the current play position time. In some instances, the controller 22 may be configured to accept user input via the user interface 18 that sets a start time of the timeline. The controller 22 may be configured to accept user input via the user interface 18 that sets an end time of the timeline, for example. In some cases, the user can select and drag the current play position marker along the timeline (e.g. using a mouse or the like) to a desired time.

In some cases, the controller 22 may be configured to display on the display 20 an event log concurrently with the animatable heat map, as indicated at block 40. The event log may include one or more identified events along with one or more control actions that are automatically generated by the system in response to the one or more identified events. The identified events may, for example, include examples of one or more of the performance parameters 14 trending out of compliance with a desired set point or range, and the control actions that are automatically generated may include control actions that are expected to resolve the developing problem, such as changing a valve position, increasing a fan speed, activating a second stage of cooling or heating, and/or any other suitable control action.

In some cases, the controller 22 may be configured to display on the animatable heat map one or more icons that indicate an out of range condition. The controller 22 may be configured to display on the animatable heat map one or more icons that indicate an alarm condition.

Figure 3:
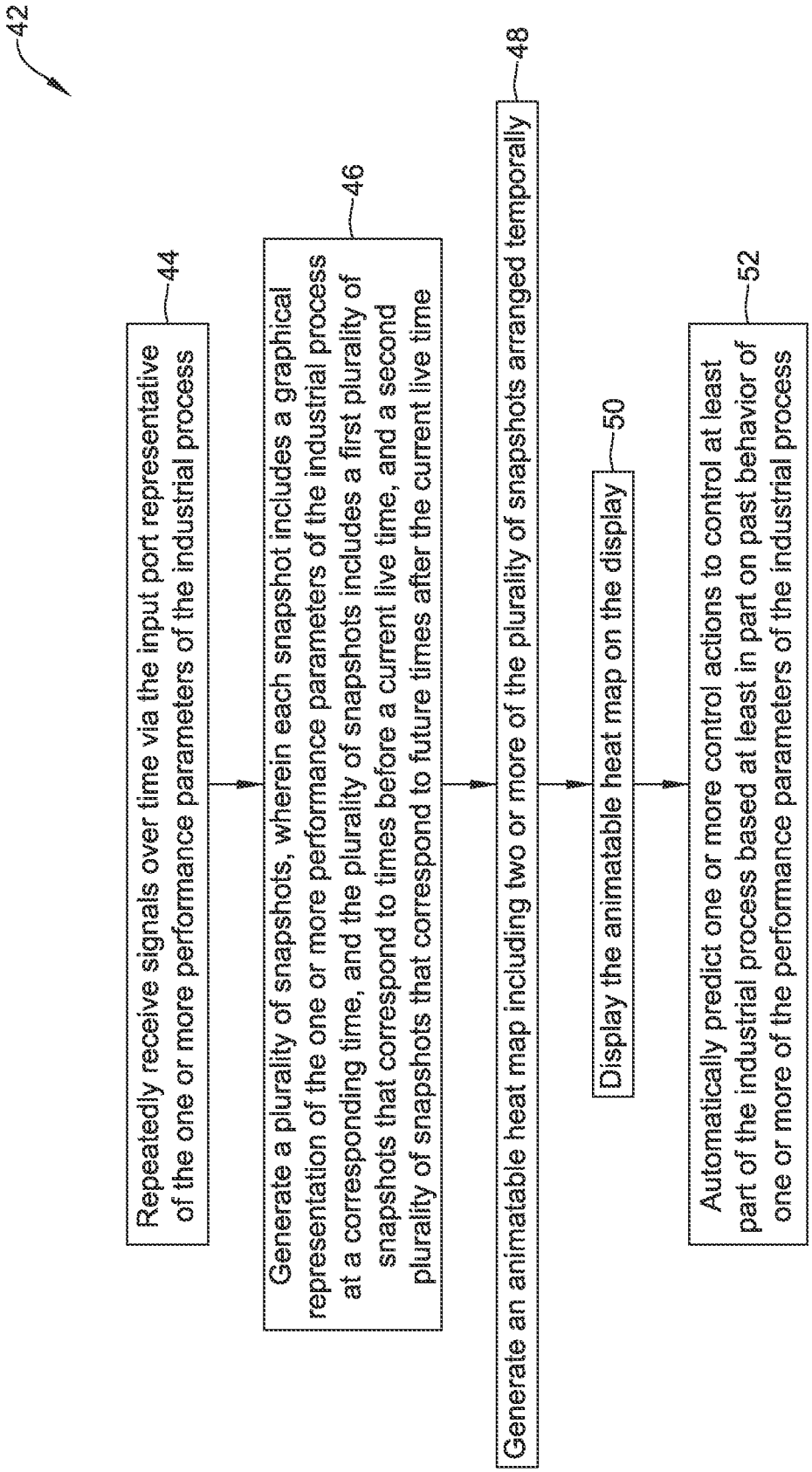
FIG. 3 is a flow diagram showing what the illustrative system of FIG. 1 may be configured to perform.

FIG. 3 is a flow diagram showing an illustrative list of tasks 42 that the controller 22 may be configured to carry out in monitoring the industrial process 12. The controller 22 may be configured to repeatedly receive signals over time via the input port 16 that are representative of the one or more performance parameters 14 of the industrial process 12, as indicated at block 44. The controller 22 may be configured to generate a plurality of snapshots, wherein each snapshot includes a graphical representation of the one or more performance parameters 14 of the industrial process 12 at a corresponding time, as indicated at block 46. In some cases, the plurality of snapshots include a first plurality of snapshots that correspond to times before a current live time, and a second plurality of predicted snapshots that correspond to future times after the current live time.

The controller 22 may be configured to generate an animatable heat map including two or more of the plurality of snapshots arranged temporally, as indicated at block 48 as well as to display the animatable heat map on the display 20, as indicated at block 50. The controller 22 may be configured to display a timeline along with the animatable heat map, the timeline including a current play position marker that indicates a current play position time along the timeline. The controller 22 may be configured to display on the display 20 the particular snapshot of the plurality of snapshots that corresponds to the current play position time. In some instances, the controller 22 may be configured to accept user input via the user interface 18 that sets a start time of the timeline. The controller 22 may be configured to accept user input via the user interface 18 that sets an end time of the timeline, for example. In some cases, the user can select and drag the current play position marker along the timeline (e.g. using a mouse or the like) to a desired time.

The current play position time may correspond to a previous time (before a current live time) that corresponds to one or more of the first plurality of snapshots. The current play position time may include a future time that has not yet happened, and thus the displayed animatable heat map may include one or more of the second plurality of predicted snapshots. The timeline may include a future time region along the timeline, wherein when the current play position marker is positioned in the future time region of the timeline, the controller is configured to display predicted snapshots that are based at least in part on a past behavior of one or more of the performance parameters of the industrial process.

In some cases, the controller 22 may be configured to predict at least some of the second plurality of snapshots based at least in part on a past behavior of one or more of the performance parameters 14 of the industrial process 12. In some cases, the controller 22 may be configured to automatically predict one or more control actions to control at least part of the industrial process 12 based at least in part on past behavior of one or more of the performance parameters 14 of the industrial process 12, as indicated at block 52. In some cases, the controller 22 may use Artificial Intelligence and/or Machine Learning to predict the behavior of one or more of the performance parameters 14 based at least in part on a past behavior of one or more of the performance parameters 14 of the industrial process 12. In some cases, the controller 22 may use Artificial Intelligence and/or Machine Learning to predict one or more control actions to control at least part of the industrial process 12 based at least in part on past behavior of one or more of the performance parameters 14 of the industrial process 12.

Figure 4:
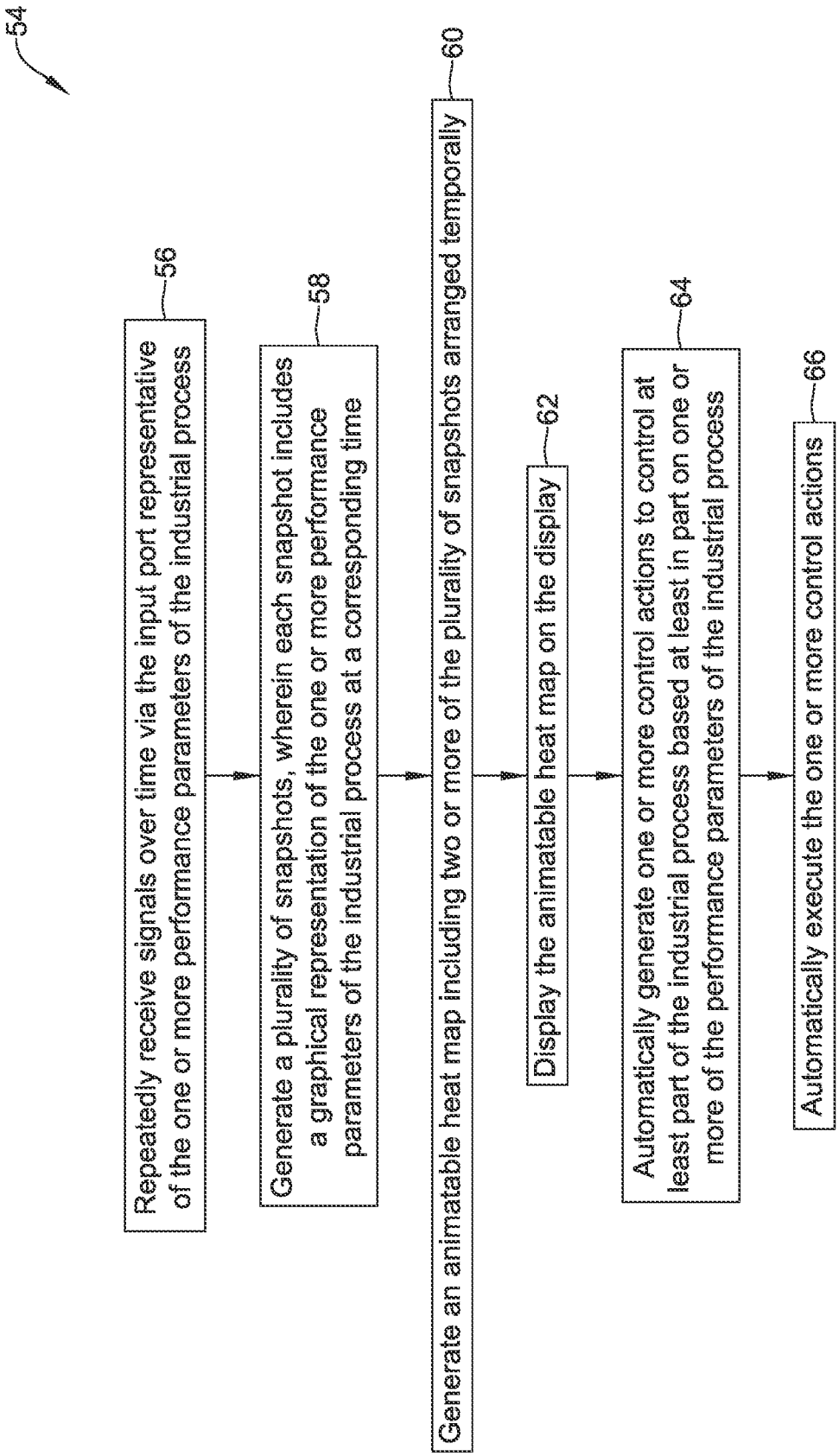
FIG. 4 is a flow diagram showing what the illustrative system of FIG. 1 may be configured to perform.

FIG. 4 is a flow diagram showing an illustrative list of tasks 54 that the controller 22 may be configured to carry out in monitoring the industrial process 12. The controller 22 may be configured to repeatedly receive signals over time via the input port 16 that are representative of the one or more performance parameters 14 of the industrial process 12, as indicated at block 56. The controller 22 may be configured to generate a plurality of snapshots, wherein each snapshot includes a graphical representation of the one or more performance parameters 14 of the industrial process 12 at a corresponding time, as indicated at block 58. The controller 22 may be configured to generate an animatable heat map including two or more of the plurality of snapshots arranged temporally, as indicated at block 60 as well as to display the animatable heat map on the display 20, as indicated at block 62. In some instances, the animatable heat map may include a number of snapshots arranged temporally. For example, a snapshot may be generated every second, every minute, every five minutes, or every ten minutes. Other time intervals are contemplated. The snapshots can be temporally assembled into something resembling a video clip that can be played, rewound, and fast forwarded.

In some instances, and as indicated at block 64, the controller 22 may be configured to automatically generate one or more control actions to control at least part of the industrial process 12 based at least in part on one or more of the performance parameters 14 of the industrial process 12, as indicated at block 64. The controller 22 may be configured to automatically execute the one or more control actions, as indicated at block 66. In some instances, the controller 22 may be configured to automatically identify one or more events based at least in part on one or more of the performance parameters 14 of the industrial process 12, and wherein the one or more control actions are automatically generated in response to one or more of the automatically identified events.

In some cases, the controller 22 may be configured to display an event log concurrently with the animatable heat map, wherein the event log includes one or more of the identified events along with one or more control actions that are automatically generated in response to the one or more identified events. In some cases, the controller 22 may be configured to display a timeline concurrently with the event log and the animatable heat map, the timeline including a current play position marker that indicates a current play position time along the timeline, wherein the controller is configured to display the particular snapshot of the plurality of snapshots that corresponds to the current play position time. The controller 22 may be configured to display an event marker along the timeline for each of one or more of the identified events, with each event marker positioned along the timeline at a time that corresponds to a time of occurrence of the corresponding event.

Figure 5:
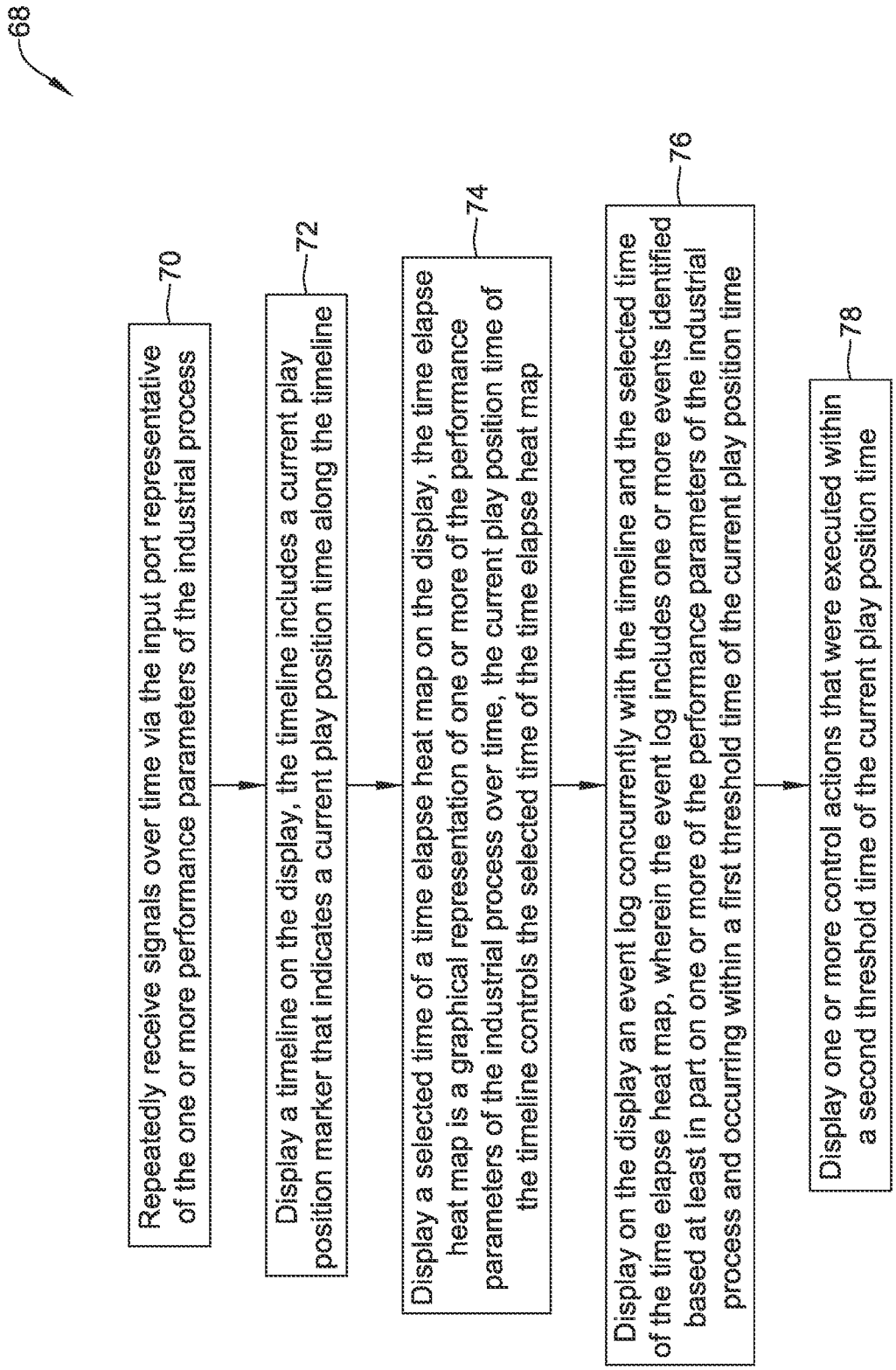
FIG. 5 is a flow diagram showing what the illustrative system of FIG. 1 may be configured to perform.

FIG. 5 is a flow diagram showing an illustrative list of tasks 68 that the controller 22 may be configured to carry out in monitoring the industrial process 12. The controller 22 may be configured to repeatedly receive signals over time via the input port 16 that are representative of the one or more performance parameters 14 of the industrial process 12, as indicated at block 70. The controller 22 may be configured to display a timeline on the display 20 that includes a current play position marker that indicates a current play position time along the timeline, as indicated at block 72. The controller 22 may be configured to display a selected time of a time elapse heat map on the display 20, the time elapse heat map being a graphical representation of one or more of the performance parameters 14 of the industrial process 12 over time and the current play position time of the timeline controls the selected time of the time elapse heat map, as indicated at block 74. The controller 22 may be configured to display on the display 20 an event log concurrently with the timeline and the selected time of the time elapse heat map, wherein the event log includes one or more events identified based at least in part on one or more of the performance parameters 14 of the industrial process 12 and occurring within a first threshold time of the current play position time, as indicated at block 76.

In some cases, as indicated at block 78, the controller 22 may be configured to concurrently display on the display 20 one or more control actions that were executed within a second threshold time of the current play position time. The timeline may include a future time region along the timeline, wherein when the current play position marker is positioned in the future time region of the timeline, the controller 22 may be configured to display a predicted time elapse heat map based at least in part on a past behavior of one or more of the performance parameters of the industrial process. The controller 22 may be configured to display controls that can be used to stop, play, rewind and fast forward the time elapse heat map.

Figure 6:
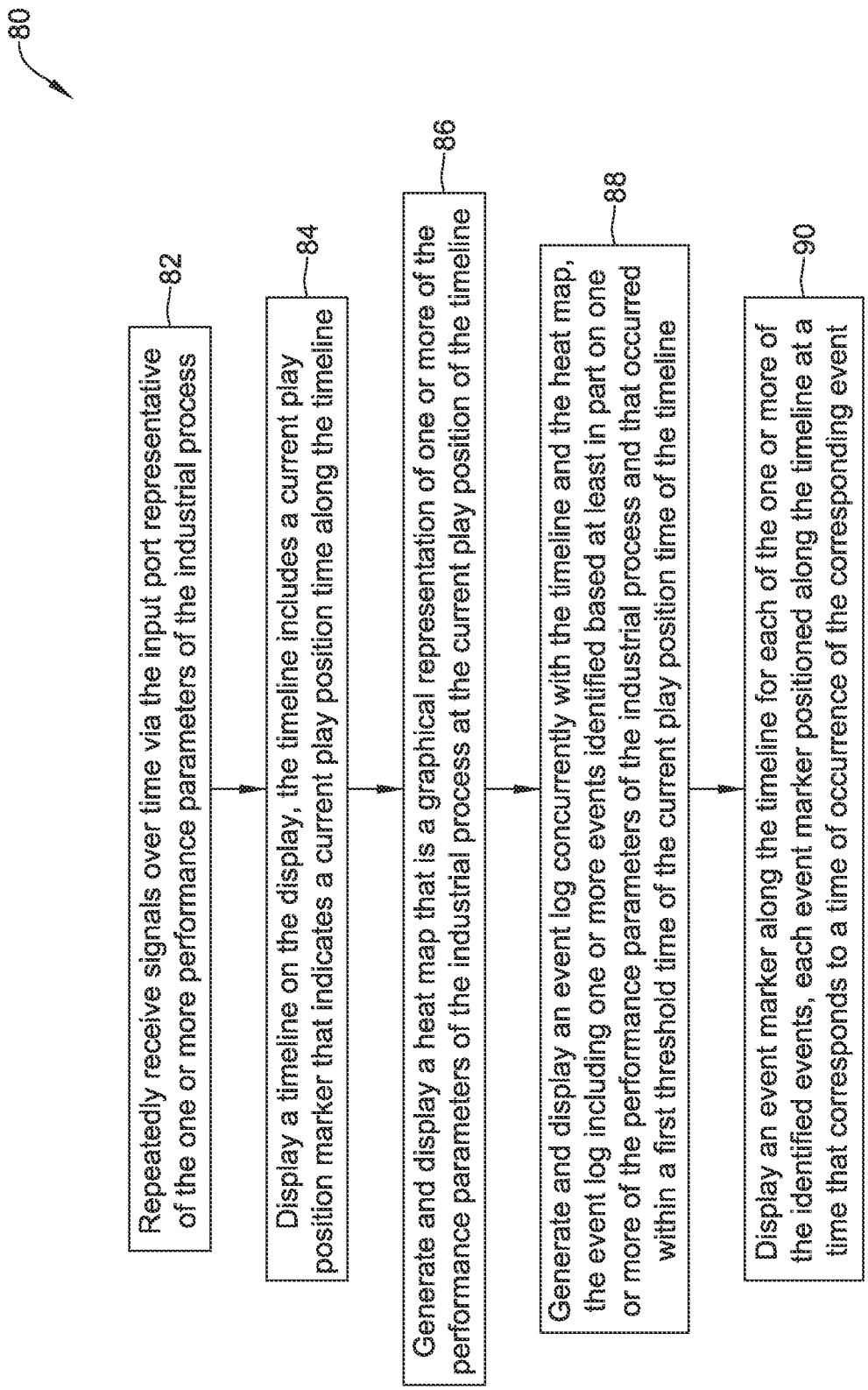
FIG. 6 is a flow diagram showing what the illustrative system of FIG. 1 may be configured to perform.

FIG. 6 is a flow diagram showing a series of tasks 80 that may be carried out by the controller 22 when the controller 22 executes instructions that may be stored within the memory 24. The controller 22 may repeatedly receive signals over time representative of the one or more performance parameters 14 of an industrial process 12, as indicated at block 82. The controller 22 may display a timeline on the display 20 that includes a current play position marker that indicates a current play position time along the timeline, as indicated at block 84. The controller 22 may generate and display a heat map that is a graphical representation of one or more of the performance parameters 14 of the industrial process 12 at the current play position time of the timeline, as indicated at block 86. The controller 22 may generate and display an event log concurrently with the timeline and the heat map, the event log including one or more events identified based at least in part on one or more of the performance parameters 14 of the industrial process 12 and that occurred within a first threshold time of the current play position time of the timeline, as indicated at block 88. The controller 22 may display an event marker along the timeline for each of one or more of the identified events, with each event marker positioned along the timeline at a time that corresponds to a time of occurrence of the corresponding event, as indicated at block 90.

Figure 7:
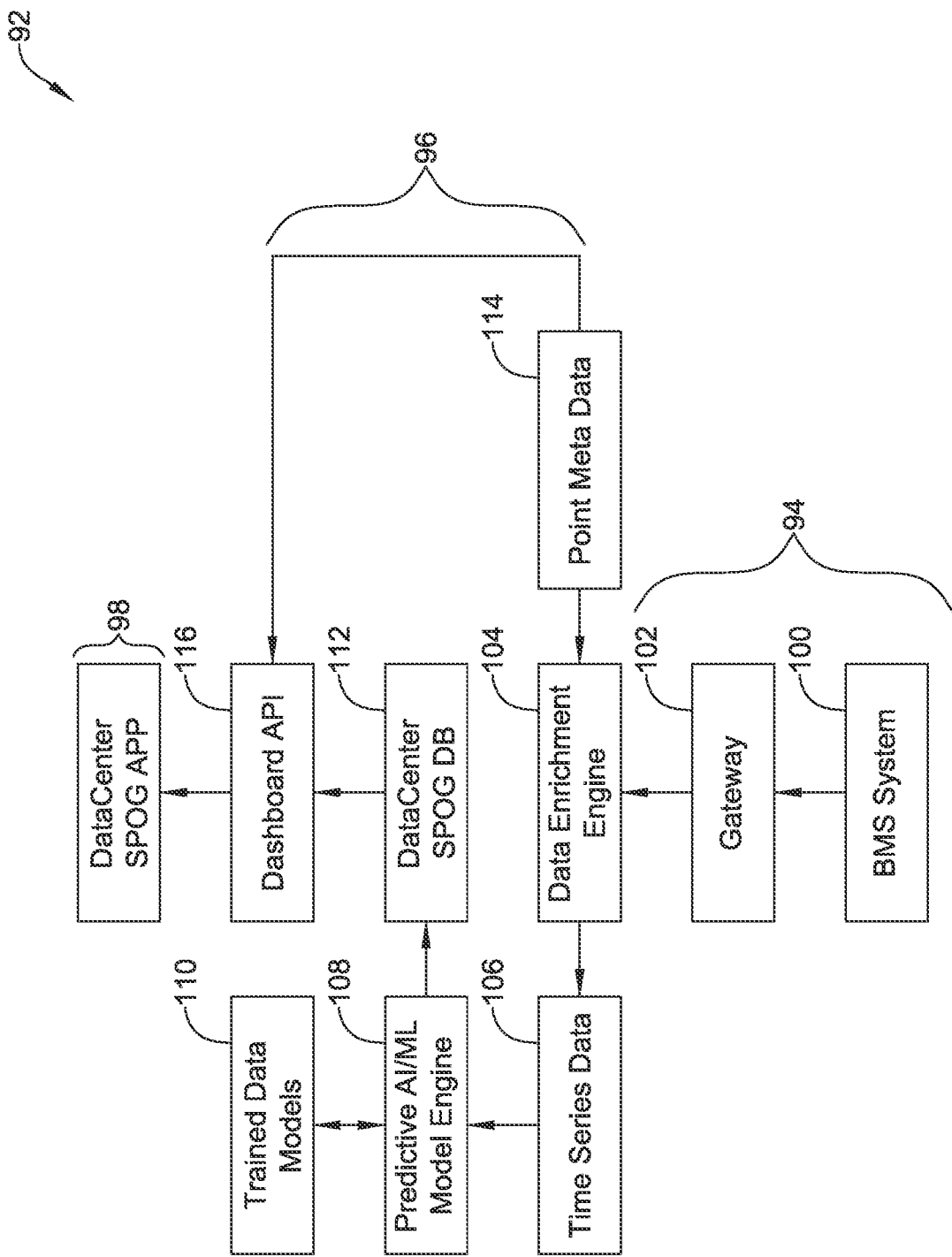
FIG. 7 is a schematic block diagram of an illustrative system for monitoring performance of an industrial process.

FIG. 7 is a schematic block diagram of an illustrative system 92 for monitoring performance of an industrial process such as the industrial process 12. The illustrative system 92 may be considered as being divided into three portions or sections. An onsite portion 94 corresponds to the site of the industrial process. An analytical portion 96, which may be manifested within a computer or within a cloud-based server for example, performs the analytics necessary to power a SPOG dashboard application 98. SPOG refers to Single Pane of Glass, which means that the SPOG application 98 is configured to receive information from potentially a number of different systems and/or platforms and provide a single dashboard that provides all of the relevant information to a user, regardless of the source of the information.

In this example, the onsite portion 94 includes a BMS (Building Management System) 100. It will be appreciated that the BMS 100 may be configured to receive a variety of information that may be related to a particular industrial process (such as the industrial process 12) and may share the information with the analytical portion 96, sometimes via a Gateway 102. The Gateway 102 may, for example, function to operably couple the BMS 100 with a network such as the Internet.

The analytical portion 96 can be seen as including a number of components. It will be appreciated that at least some of these components may not be separate components, but may represent particular functionality that may be manifested within a computing system. Information from the Gateway 102 may be provided to a Data Enrichment Engine 104 which provides the information to a Time Series Database 106. The Time Series Database 106 may store information over time. In the example shown, the Time Series Database 106 communicates with a Predictive AI/ML (Artificial Intelligence/Machine Learning) Model engine 108. The Predictive AI/ML Model engine 108 shares information with a Trained Data Models block 110. The Trained Data Models block 110 may store one or more models that have been trained by the Predictive AI/ML Model engine 108, for example, by analyzing past data. The Predictive AI/ML Model engine 108 also communicates with a Data Center database 112. A Point Metadata block 114 communicates with both the Data Enrichment Engine 104 and a Dashboard API (Application Programming Interface) 116. The Dashboard API 116 provides information to the Data Center SPOG app 98.

Figure 8A:
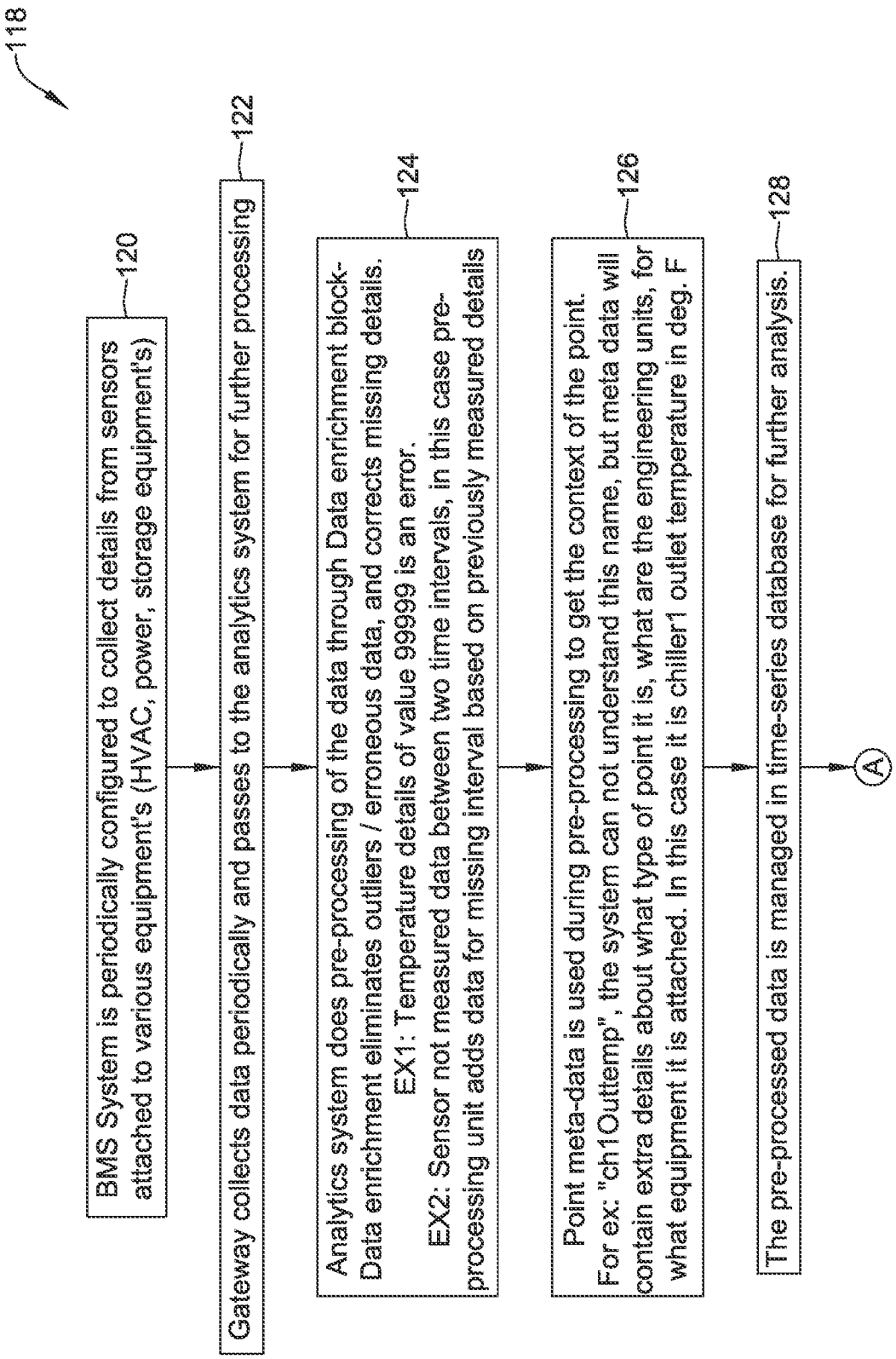
FIGS. 8A and 8B provide a flow diagram showing steps that may be carried out by the illustrative system of FIG. 7.
Figure 8B:
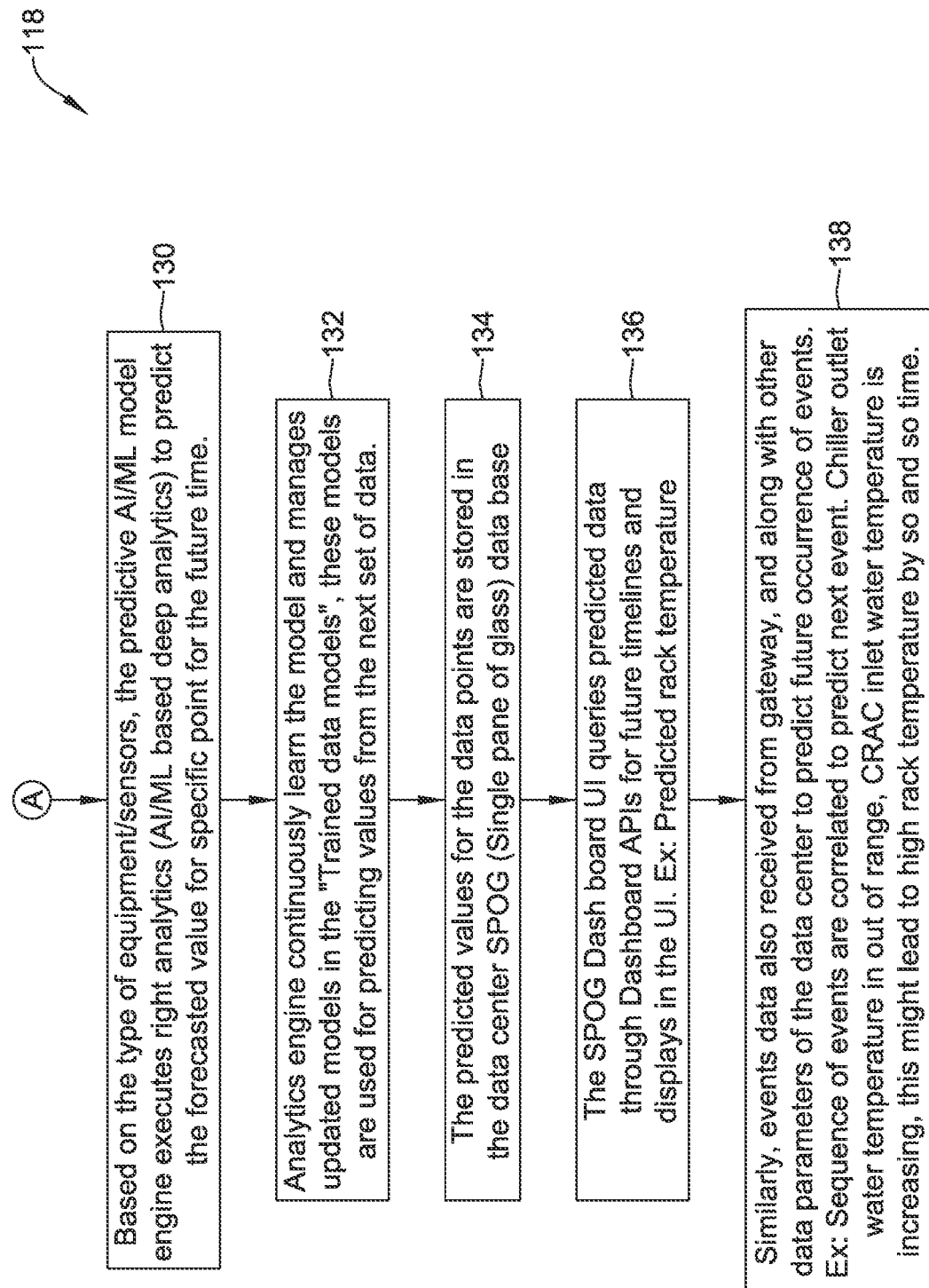

FIGS. 8A and 8B together provide a flow diagram showing an illustrative method 118 that may be carried out via the analytical portion 96 of FIG. 7. As indicated at block 120, the BMS 100 may be configured to periodically retrieve data from a variety of different sensors that provide information relevant to the particular industrial process. In this example, the industrial process is a data center. As indicated at block 122, the Gateway 102 collects data periodically and shares the data with the Analytical portion 96 for further processing.

As indicated at block 124, in the example shown, the Analytical portion 96 does initial processing of the data using the Data Enrichment Engine 104. In some cases, data enrichment includes eliminating outliers and other obviously incorrect data points, and may include correcting missing details (e.g. extrapolating to fill in some missing or obviously incorrect data). Control passes to block 126, where the Point Metadata block 114 uses metadata to provide context for the particular data. As indicated at block 128, the pre-processed data is managed in the Time Series Database 106 for further analysis. As indicated at block 130, the Predictive AI/ML Model engine 108 uses the appropriate analytics to predict future values for particular data points. The Predictive AI/ML Model engine 108 may also be used to predict one or more control actions to control at least part of the particular industrial process based at least in part on past behavior of the particular data points. Artificial intelligence and/or machine learning may be used to determine the appropriate analytics.

Turning to FIG. 8b, and as indicated at block 132, the Trained Data Models block 110 continues to learn/refine new models and improve existing models. The predicted values are stored in the Data Center SPOG database 112, as indicated at block 134. As indicated at block 136, the SPOG Dashboard App 98 receives inquiries via a user interface (such as the user interface 18). As indicated at block 138, events data is also received from the Gateway 102.

Figure 9:
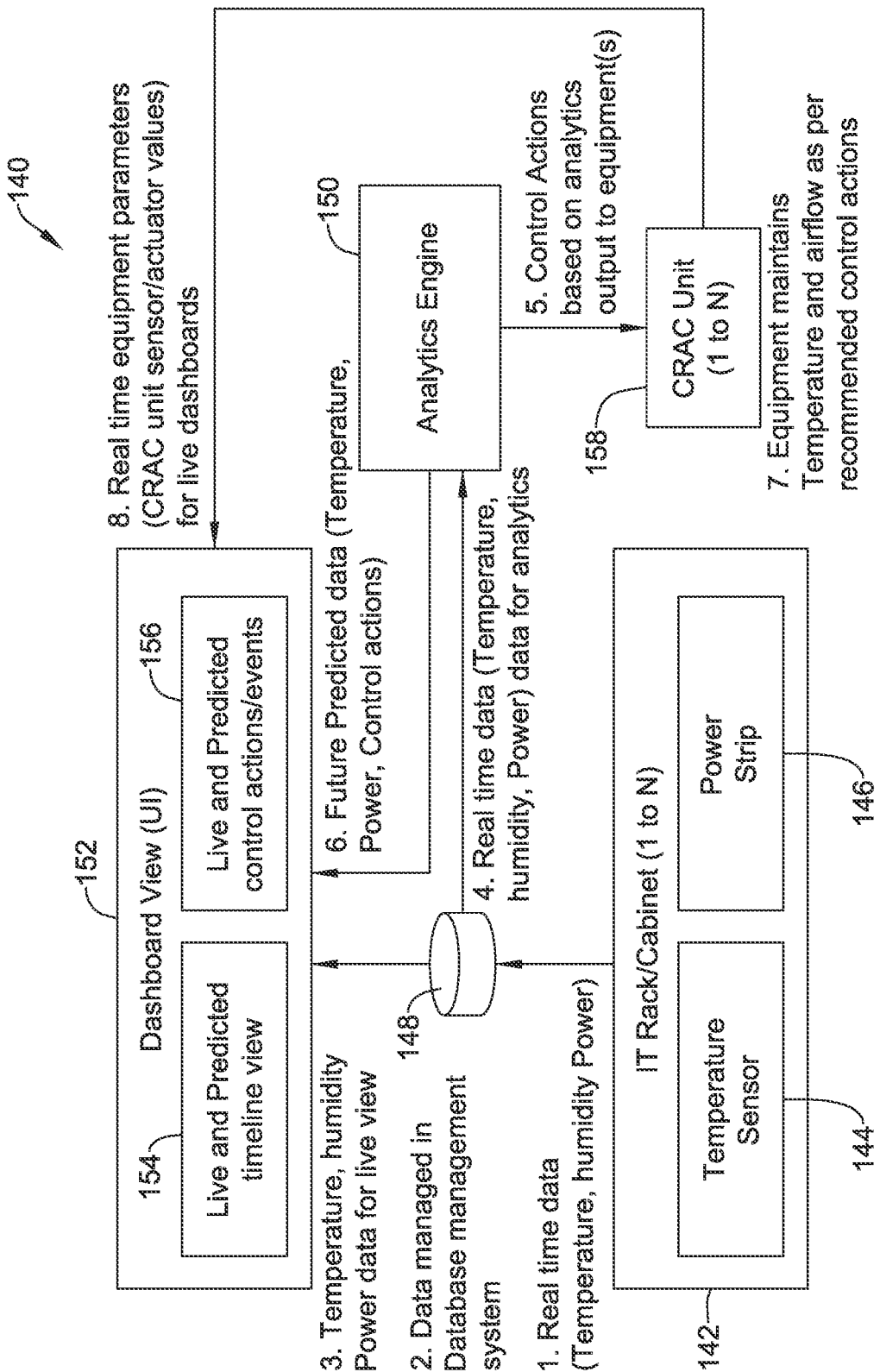
FIG. 9 is a schematic diagram showing data flow in an illustrative system for monitoring a data center.

FIG. 9 is a schematic diagram showing a data flow 140 in an illustrative system for monitoring a data center. While this example is specific to an IT rack using CRAC (Computer Room Air Conditioner) equipment, it will be appreciated that this example can be generalized to other types of thermal and power equipment such as but not limited to UPS (Uninterruptible Power Supply), batteries, generators, CRAH (Computer Room Air Handler) units, chillers and the like.

An IT rack 142 includes a number of computer servers, and includes a temperature sensor 144 and a power strip 146. Real time data, including temperature values and power consumption values are provided to a Database 148 and are subsequently provided to an Analytics Engine 150 for further analysis. The live data as well as future predicted values are provided to the User Interface (Dashboard View) 152. The UI 152 facilitates display of both live and predicted timeline views 154 as well as live and predicted control actions and events 156. A series of CRAC units 158 maintain temperature and airflow through the IT rack 142 in accordance with recommend control actions.

Figure 10:
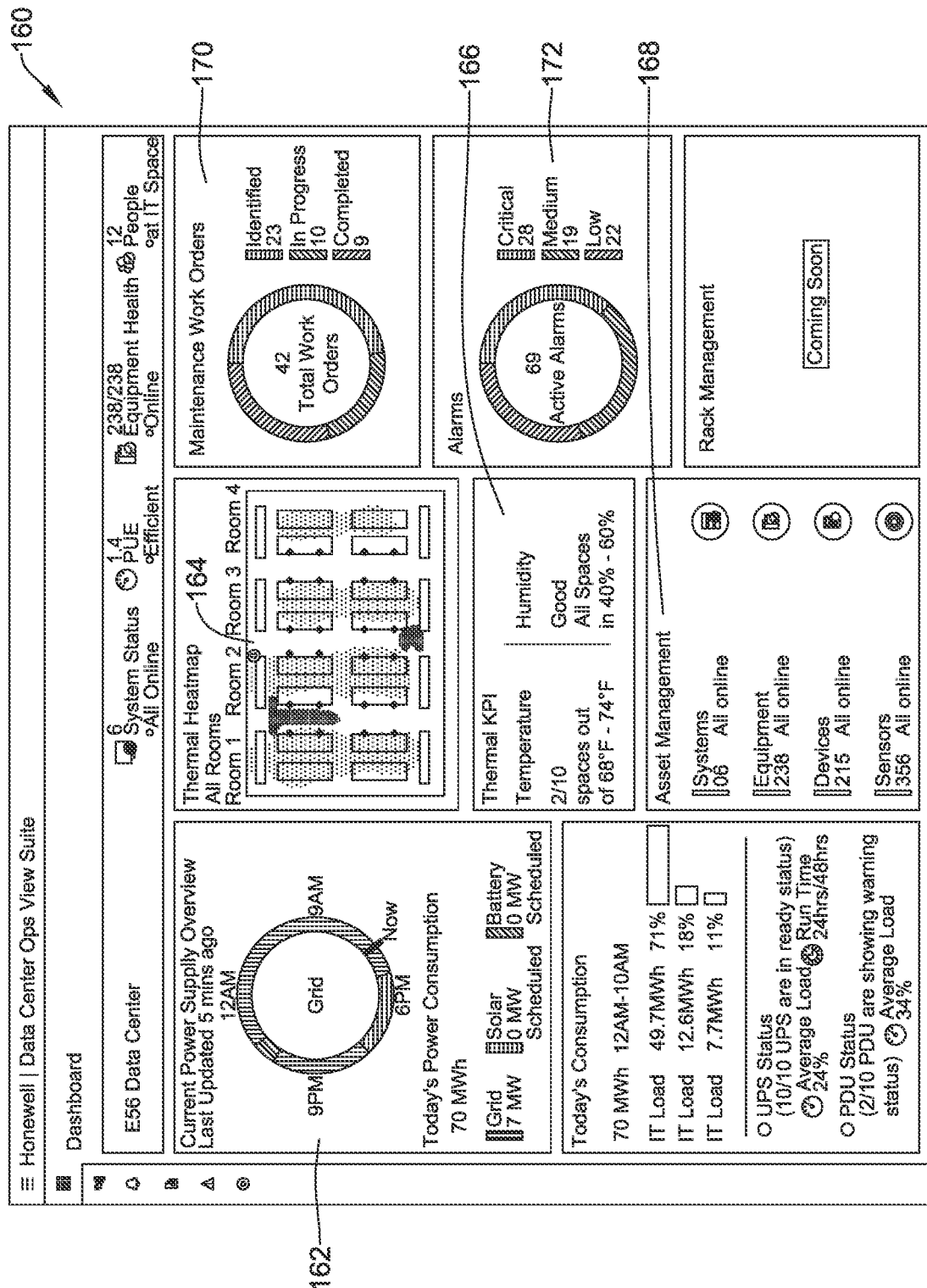
FIG. 10 shows a dashboard that may be generated in monitoring performance of a data center.

FIG. 10 provides an example of a dashboard 160 that may be generated in monitoring performance of a data center. The illustrative dashboard 160 includes a substantial amount of information displayed in a concise, easily understood manner, even though some of the information may have originated in multiple systems. It can be seen that the dashboard 160 includes a Power Supply Overview section 162 that provides information pertaining to power consumption, including a breakdown of how much power was consumed by various types of equipment. The illustrative dashboard 160 includes a thermal heat map 164 that will be described in greater detail with respect to FIG. 11. A Thermal KPI (Key Performance Indicator) section 166 provides information regarding which sections are in or out of compliance with respect to temperature and humidity. An Asset Management section 168 provides a summary of online equipment.

The illustrative dashboard 160 includes a Maintenance Work Orders section 170 that shows the status of work orders, including a number of identified work orders, a number of completed work orders and a number of in progress work orders. An Alarms section 172 shows how many alarms are currently active for the industrial process, including a breakdown of the relative severity of the current alarms. Clicking on the thermal heat map 164 may cause display of additional information, as seen for example in FIG. 11.

Figure 11:
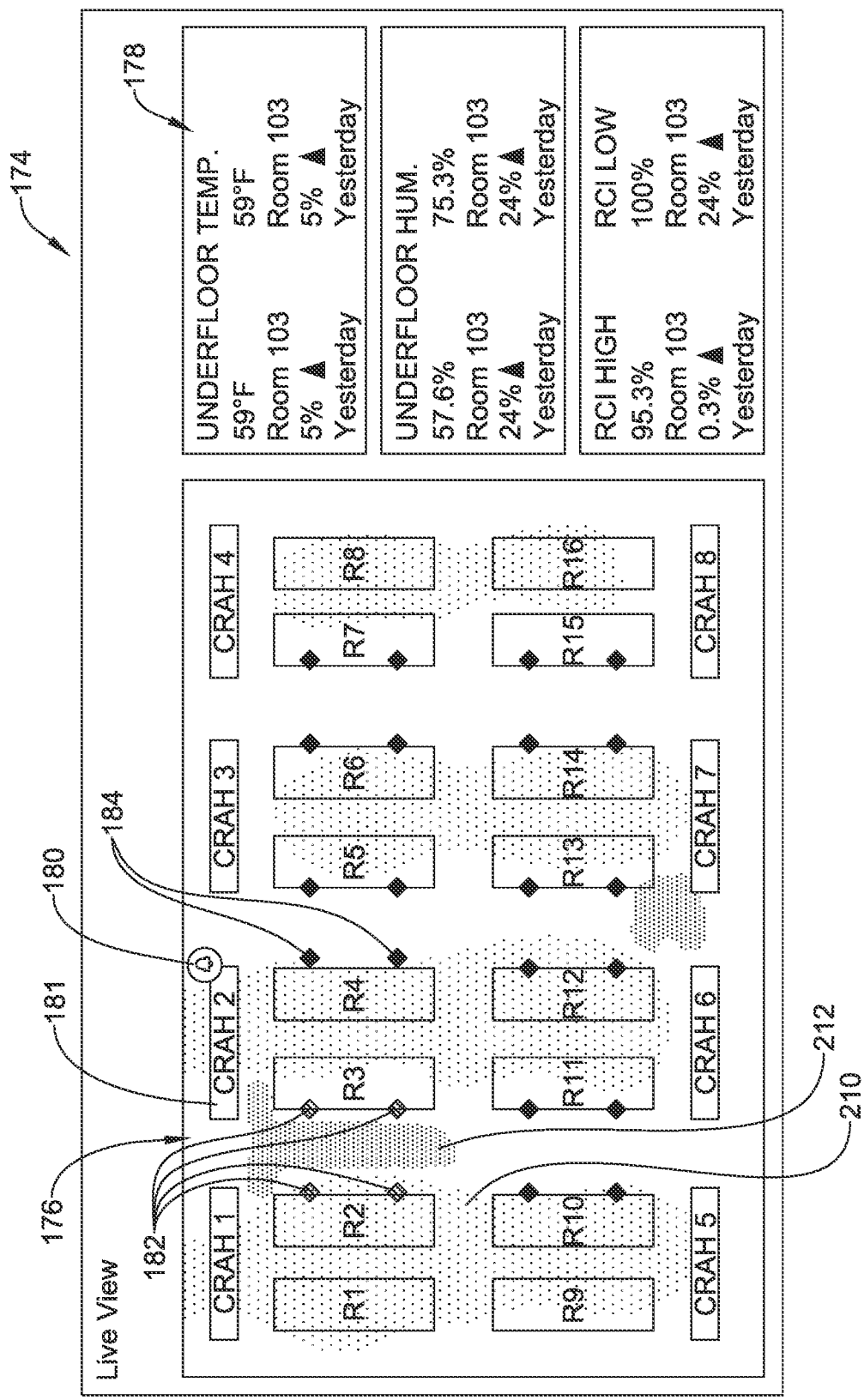
FIG. 11 shows a live view of a dashboard that may be generated in monitoring performance of a data center.

FIG. 11 provides an example of a dashboard 174 that is similar to the thermal heat map 164, but includes additional information. In this example, the dashboard 174 is displaying a current thermal heat map 176 and a conditions summary 178 of a data center. The illustrative data center includes sixteen (16) IT racks (R1-R16) and eight (8) CRAH (Computer Room Air Handling) Units responsible for maintaining environmental conditions for the IT racks. In the example shown, the CRAH units provide conditioned air through the floor to the IT racks. The conditions summary 178 shows that the daily minimum underfloor temperature for room 103 and the daily maximum underfloor temperature for room 103 are both 59 degrees Fahrenheit (F), which is a 5 percent increase from the previous day. The conditions summary 178 shows that the minimum daily underfloor humidity value for room 103 is 57.6% and the maximum daily underfloor humidity value for room 103 is 75.3%, and that both represent a 24% increase from the previous day. The conditions summary 178 also shows that the Rack Cooling Index (RCI) for room 103 had a daily high RCI value of 95.3% and a daily low RCI value of 100%. The daily high RCI value is an increase of 0.3% relative to the previous day while the daily low RCI value represents a 24% increase from the previous day.

There are several points of interest in the thermal heat map 176. The thermal heat map 176 shows relative temperatures in and around a total of sixteen (16) racks labeled R1 through R16. The thermal heat map 176 can show relative temperatures using various colors or patterns. For example, in a color display, the thermal heat map 176 may show an expected or base temperature in yellow. Temperatures that are greater than that may be shown in orange or even red, for example, while temperatures that are lower than the expected or base temperature may be shown in blue. In some cases, the various temperatures may be shown using different shading or patterns, with shading or pattern intensity reflecting relative temperatures. For example, an area that is slightly warmer than the expected or base temperature may be represented using a first shading or pattern in a relatively light or sparsely filled manner. An area that is significantly warmer may utilize the first shading or pattern in a more dense manner. Similarly, an area that is slightly cooler than the expected or base temperature may be represented using a second shading or pattern in a relatively light or sparsely filled manner. An area that is significantly cooler may utilize the second shading or pattern in a more dense manner. These are just examples.

In some cases, as seen for example in FIG. 11, a first shading pattern 210 is used to denote relatively cooler temperatures and a second shading pattern 212 is used to denote relatively warmer temperatures. The first shading pattern 210 may be considered as representing blue while the second shading pattern 212 may be considered as representing orange or even red. These are just examples, as other shading patterns may also be used to indicate differences in relative temperatures.

The thermal heat map 176 includes an alarm icon 180 that indicates that CRAH (Computer Room Air Handler) 181 is currently in alarm. The thermal heat map 176 also includes temperature sensor icons that represent individual temperature sensors that are distributed about the racks R1-R16. As seen, several temperature sensor icons 182 can be seen in a shading or pattern that indicates that the particular temperature sensors represented by the temperature sensor icons 182 are currently reporting a temperature that is relatively warm. In some cases, various colors may be also be used. The thermal heat map 176 includes a number of temperature sensor icons 184 that are in a shading or pattern that indicates that the particular temperature sensors represented by the temperature sensor icons 184 are currently reporting a temperature that is within an expected range. In some cases, various colors may also be used. In some cases, other colors, shading or patterns may be used to indicate that the particular temperature sensors represented by those temperature sensor icons are currently reporting a temperature that is somewhat cooler than an expected temperature range.

Figure 12:
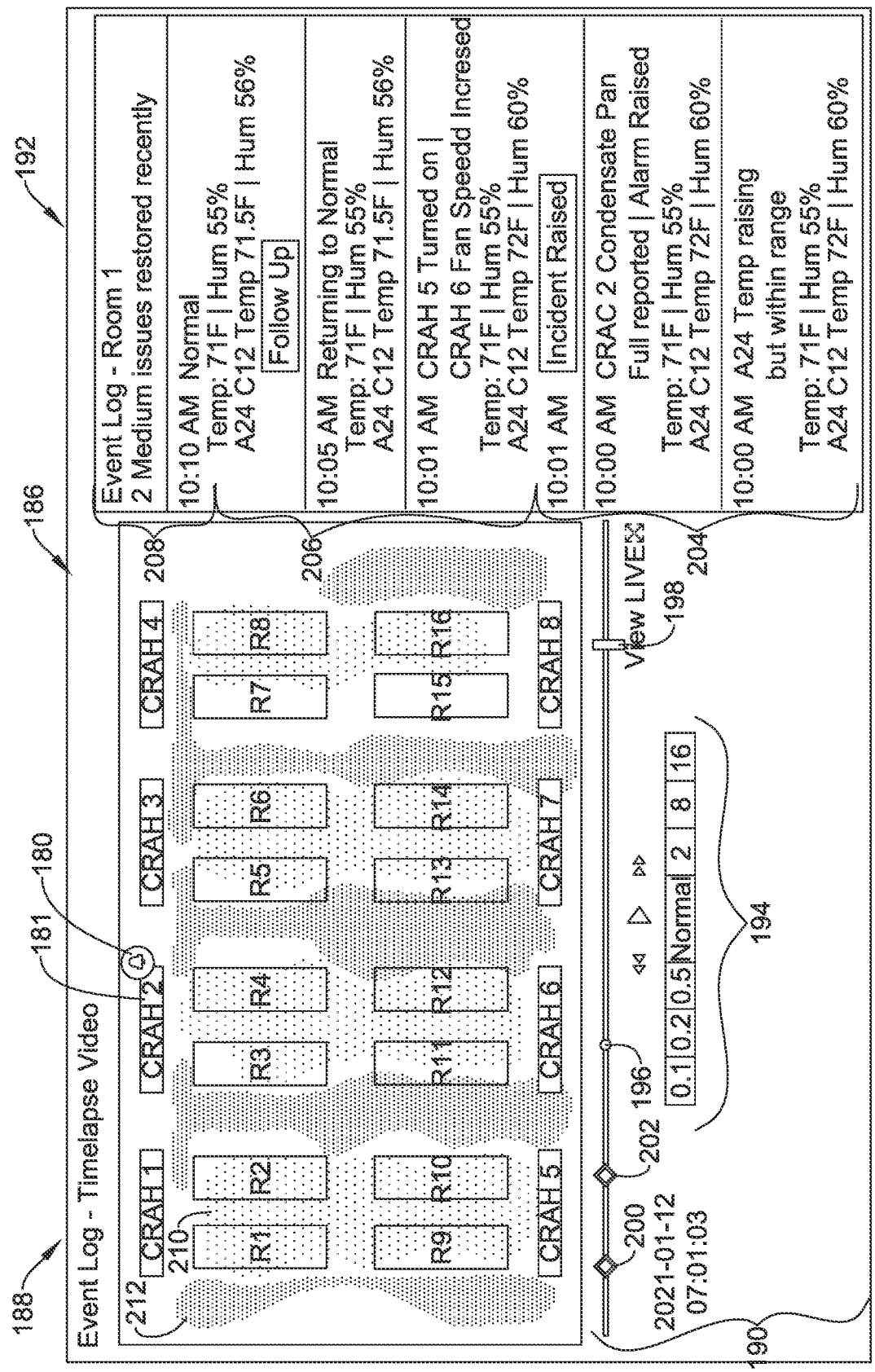
FIG. 12 shows a recorded view of a dashboard that may be generated in monitoring performance of a data center.

FIG. 12 provides an example of a dashboard 186 that includes a thermal heat map 188, Timeline 190 and an Event Log 192, all shown concurrently on a display screen. The thermal heat map 188 is similar to the thermal heat map 176. The thermal heat map 188 does not include the temperature sensor icons 182, 184, but they could be provided. In some cases, the thermal heat map 188 does not necessarily represent current temperature values, but can represent historical data or even future predicted data, depending on the position of a current play position marker or icon 196. A number of snapshots, each corresponding to a particular point in time, can be assembled in temporal order, and one can move back and forth through the number of snapshots as if one were viewing a video clip or animation. Accordingly, the timeline 190 may include a set of video-style controls 194 that allow a user to play, stop, rewind or even fast forward through. In some cases, the user can select and drag the current play position marker or icon 196 along the timeline (e.g. using a mouse or the like) to a desired time. The set of video-style controls 194 may also permit a user to adjust a playback speed.

The illustrative Timeline 190 also includes a current live time icon 198 that indicates a current live time. Hence, if the current play position marker or icon 196 is to the left of the current live time icon 198, it is easy to see that the displayed thermal heat map 188 represents data from the past. If the current play position marker or icon 196 is to the right of the current live time icon 198, the user can see that the displayed thermal heat map 188 represents future or predicted data. The illustrative Timeline 190 also includes icons 200, 202 that mark particular events or other anomalies in the operation of the data center.

The Event Log 192 provides a list of events and corresponding corrective actions. In this way, a user viewing the dashboard 186 is able to scroll back and forth in time along the Timeline 190, and the displayed thermal heat map 188 will change to reflect the corresponding temporal data, and the Event Log 192 will scroll to show the corresponding events and how the system responded to those events at those times. For example, a review of the Event Log as displayed indicates, with respect to a region 204 thereof, that at LOAM the A24 temperature was still within range but was increasing, and that the CRAC 2 condensate pan of the CRAH 2 was reported to be full. At 10:01 am, an incident was raised. In response, and as seen within region 206 of the Event Log, at 10:01 am CRAH 5 was turned on and the CRAH 6 fan speed was increased, thereby boosting the air conditioning delivered to racks R3 and R4. At 10:05 am, a notation indicates that temperature at A24 was returning to normal. Later, and as seen within a region 208 of the Event Log, a follow up indicates that as of 10:10 am, the A24 temperature had returned to normal.

Those skilled in the art will recognize that the present disclosure may be manifested in a variety of forms other than the specific embodiments described and contemplated herein. Accordingly, departure in form and detail may be made without departing from the scope and spirit of the present disclosure as described in the appended claims.

What is claimed is:

1. A system for monitoring performance of a data center that includes a plurality of computer servers arranged in a plurality of racks, the system comprising:
   an input port for receiving signals representative of a plurality of performance parameters of the data center each associated with a corresponding physical location in the data center;
   a user interface including a display;
   a controller operably coupled with the input port and the user interface, the controller configured to:
      repeatedly receive over time via the input port signals representative of the plurality of performance parameters in the data center;
      display a floorplan view of at least part of the data center on the display, the floorplan view showing:
         a relative physical location of at least some of the plurality of racks in the data center;
         a heat map that includes a spatial representation of at least some of the plurality of performance parameters, wherein the heat map is spatially aligned with the relative physical location of the at least some of the plurality of racks in the floorplan view, and wherein the spatial representation of at least some of the plurality of performance parameters of the heat map is based at least in part on the signals representative of the at least some of the plurality of performance parameters of the data center and the corresponding physical location of each of the least some of the plurality of performance parameters in the data center; and wherein the heat map includes a heat map animation, wherein the heat map animation includes a plurality of heat map snapshots that are each based at least in part on the signals representative of the at least some of the plurality of performance parameters of the data center received at a corresponding time, wherein the plurality of heat map snapshots are arranged temporally such that the plurality of heat map snapshots can be sequentially viewed as a video clip or animation.

2. The system of claim 1, wherein the controller is configured to display animation controls that allow a user to manipulate the animation controls via the user interface to move temporally within the heat map animation.

3. The system of claim 2, wherein the controller is configured to display a timeline that includes a current play position marker that indicates a current play position time along the timeline, and wherein the controller is configured to display on the display the particular heat map snapshot of the plurality of heat map snapshots that corresponds to the current play position time.

4. The system of claim 3 wherein the controller is configured to accept user input via the user interface that sets at least one of a start time of the timeline and an end time of the timeline.

5. The system of claim 3, wherein the timeline includes a future time region along the timeline, wherein when the current play position marker is positioned in the future time region of the timeline, the controller is configured to display predicted heat map snapshots that are based at least in part on a past behavior of the signals representative of one or more of the plurality of performance parameters of the data center.

6. The system of claim 1, wherein the plurality of heat map snapshots includes a first plurality of heat map snapshots corresponding to times before a current live time, and a second plurality of heat map snapshots corresponding to future times after the current live time.

7. The system of claim 6, wherein the controller is configured to predict the second plurality of heat map snapshots based at least in part on a past behavior of the signals representative of one or more of the plurality of performance parameters of the data center.

8. The system of claim 1, wherein the controller is configured to:
automatically predict one or more control actions to control at least part of the data center based at least in part on a past behavior of the signals representative of one or more of the plurality of performance parameters of the data center.

9. The system of claim 1, wherein the controller is configured to:
automatically generate one or more control actions to control at least part of the data center based at least in part on the signals representative of one or more of the plurality of performance parameters of the data center; and
automatically execute the one or more control actions.

10. The system of claim 9, wherein the controller is configured to automatically identify one or more events based at least in part on the signals representative of one or more of plurality of performance parameters of the data center, and wherein the one or more control actions are automatically generated in response to one or more of the automatically identified events.

11. The system of claim 10, wherein the controller is configured to display an event log concurrently with the heat map animation, wherein the event log includes one or more of the identified events along with one or more control actions that are automatically generated in response to the one or more identified events.

12. The system of claim 11, wherein the controller is configured to display a timeline concurrently with the event log and the heat map animation, the timeline including a current play position marker that indicates a current play position time along the timeline, wherein the controller is configured to display the particular heat map snapshot of the plurality of heat map snapshots that corresponds to the current play position time.

13. The system of claim 12, wherein the controller is configured to display an event marker along the timeline for each of one or more of the identified events, each event marker positioned along the timeline at a time that corresponds to a time of occurrence of the corresponding event.

14. The system of claim 1, wherein the plurality of performance parameters in the data center are representative of one or more of:
a plurality of air temperature parameters that each represent an air temperature at a corresponding physical location in the data center;
a plurality of air humidity parameters that each represent an air humidity at a corresponding physical location in the data center; and
a plurality of power consumption parameters that each represent a power consumption at a corresponding physical location in the data center.

15. The system of claim 1, wherein the controller is configured to display on the heat map one or more icons indicating at least one of an out of range performance parameters and an alarm condition.

16. A method for monitoring performance of a data center that includes a plurality of computer servers arranged in a plurality of racks, the method comprising:
repeatedly receiving over time signals representative of a plurality of performance parameters of the data center each associated with a corresponding physical location in the data center;
displaying a floorplan view of at least part of the data center on a display, the floorplan view showing:
a relative physical location of at least some of the plurality of racks in the data center;
a heat map that includes a spatial representation of at least some of the plurality of performance parameters, wherein the heat map is spatially aligned with the relative physical location of the at least some of the plurality of racks in the floorplan view, and wherein the spatial representation of at least some of the plurality of performance parameters of the heat map is based at least in part on the signals representative of the at least some of the plurality of performance parameters of the data center and the corresponding physical location of each of the least some of the plurality of performance parameters in the data center; and
wherein the heat map includes a heat map animation, wherein the heat map animation includes a plurality of heat map snapshots that are each based at least in part on the signals representative of the at least some of the plurality of performance parameters of the data center received at a corresponding time, wherein the plurality of heat map snapshots are arranged temporally such that the plurality of heat map snapshots can be sequentially viewed as a video clip or animation.

17. A non-transitory computer readable medium storing instructions thereon that when executed by one or more processors causes the one or more processors to:
repeatedly receive over time signals representative of a plurality of performance parameters of a data center each associated with a corresponding physical location in the data center;
display a floorplan view of at least part of the data center on a display, the floorplan view including a heat map that includes a spatial representation of at least some of the plurality of performance parameters spatially aligned with the floorplan view, wherein the spatial representation of at least some of the plurality of performance parameters of the heat map is based at least in part on the signals representative of the at least some of the plurality of performance parameters of the data center and the corresponding physical location of each of the least some of the plurality of performance parameters in the data center; and
wherein the heat map includes a heat map animation, wherein the heat map animation includes a plurality of heat map snapshots that are each based at least in part on the signals representative of the at least some of the plurality of performance parameters of the data center received at a corresponding time, wherein the plurality of heat map snapshots are arranged temporally such that the plurality of heat map snapshots can be sequentially viewed as a video clip or animation.

\* \* \* \* \*